United States Patent
Crotzer et al.

[19]

[11] Patent Number: 6,056,557
[45] Date of Patent: May 2, 2000

[54] BOARD TO BOARD INTERCONNECT

[75] Inventors: David R. Crotzer, Nashua, N.H.; Stephen D. DelPrete, Rehoboth, Mass.

[73] Assignee: Thomas & Betts International, Inc., Sparks, Nev.

[21] Appl. No.: 09/056,972

[22] Filed: Apr. 8, 1998

[51] Int. Cl.[7] .................................................. H01R 9/09
[52] U.S. Cl. ............................................................ 439/66
[58] Field of Search ................................. 439/66, 91, 591

[56] References Cited

U.S. PATENT DOCUMENTS

| | | | |
|---|---|---|---|
| 5,306,558 | 4/1994 | Takahashi et al. | 428/331 |
| 5,417,577 | 5/1995 | Holliday et al. | 439/91 |
| 5,599,193 | 2/1997 | Crotzer | 439/91 |

FOREIGN PATENT DOCUMENTS

WO 90/11629  10/1990  WIPO ..................................... 439/66

OTHER PUBLICATIONS

TECKNIT, Conductive elastomeric connector, Jul. 1974.

*Primary Examiner*—Khiem Nguyen
*Assistant Examiner*—J. F. Duverne
*Attorney, Agent, or Firm*—Weingarten, Schurgin, Gagnebin & Hayes LLP

[57] ABSTRACT

A board-to-board interconnect socket (40) provides electrical interconnection between printed circuit boards (50, 52). Resilient metalized particle interconnects (28) are disposed in holes in a rigid substrate (14) of desired thickness. Each resilient interconnect (28) includes first and second cap members (18, 20) that extend from opposing ends of the hole and beyond the respective surfaces of the substrate. The first and second cap members (18, 20) may be connected with a stem member (22) or conductive paste (34) that is disposed inside the hole. The hole may be lined with conductive material (26) such as conductive plating to facilitate conduction of electricity.

15 Claims, 4 Drawing Sheets

SECTION 6-6

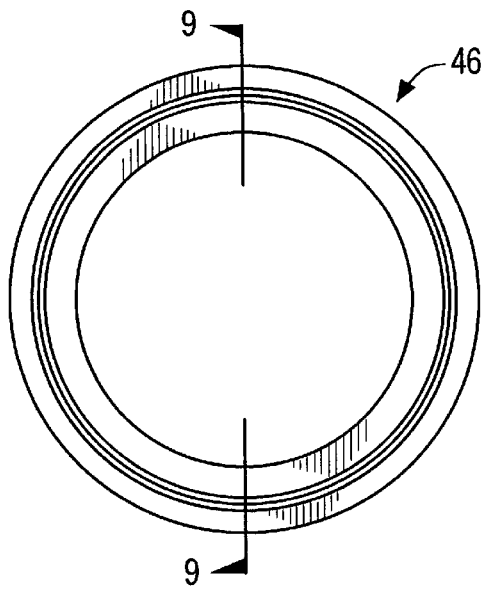 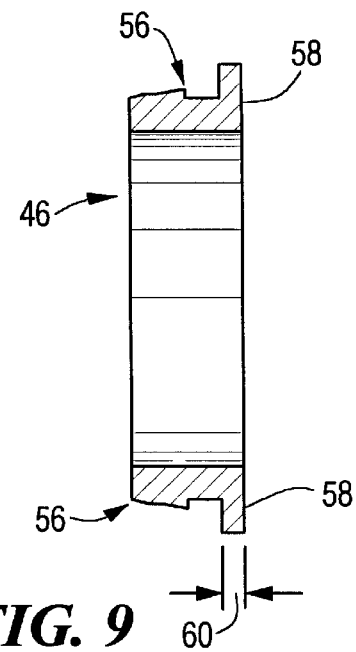
FIG. 8   FIG. 9
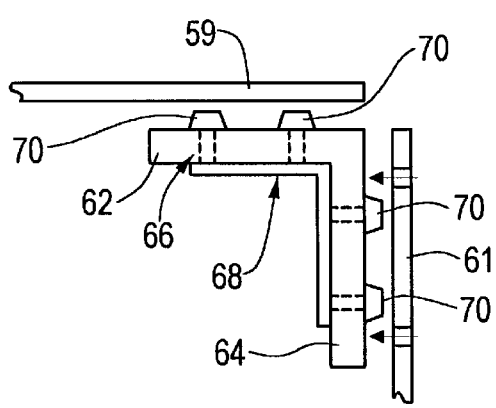 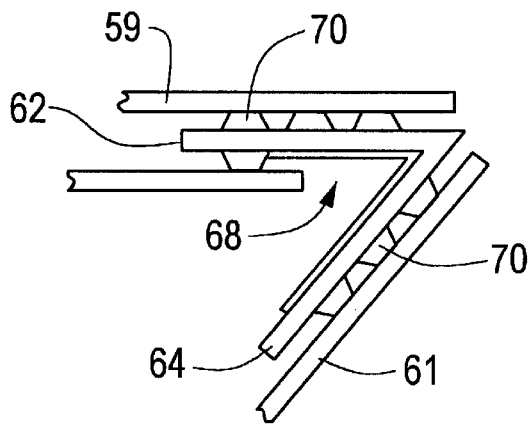
FIG. 10   FIG. 11
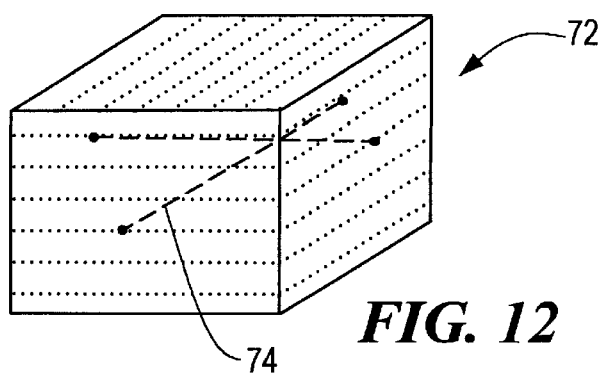
FIG. 12

BOARD TO BOARD INTERCONNECT

CROSS REFERENCE TO RELATED APPLICATIONS

Not Applicable

STATEMENT REGARDING FEDERALLY SPONSORED RESEARCH OR DEVELOPMENT

Not applicable

BACKGROUND OF THE INVENTION

This invention relates generally to electrical interconnection devices, and more particularly to sockets for interconnecting circuit boards.

Resilient interconnects for providing electrical connection between opposing surfaces of a printed circuit board are known. The resilient interconnects may be formed by combining a conductive material such as carbon particles with a resilient material such as a thermoplastic elastomer. In particular, the conductive particles are distributed throughout the resilient material of the interconnect. When the interconnect is deflected against a contact pad, some of the conductive particles push toward and possibly pierce the surface of the resilient material and form an electrical connection with the contact pad. Conductive particles distributed throughout the body of the resilient material provide electrical connection through the body of the resilient interconnect. The resilient interconnects may be disposed in holes or vias in the printed circuit board to provide electrical interconnection between the top and bottom surfaces of the printed circuit board.

Multiple printed circuit boards can be stacked surface-to-surface to enable interconnection via mated resilient interconnects. However, if the mated surfaces of the printed circuit boards are populated with components then the distance between adjacent stacked printed circuit boards must be increased. The electrical resistance exhibited by the resilient interconnect is generally greater per unit length than a conductive metal trace. Consequently, the resistance exhibited by the interconnect across a relatively large gap may be unacceptably high for some applications, such as where the components that populate the interconnected printed circuit boards have a large height dimension.

BRIEF SUMMARY OF THE INVENTION

In accordance with the present invention, a board-to-board interconnect socket is provided for electrical connection between printed circuit boards. The board-to-board interconnect socket employs a rigid substrate of desired thickness, and resilient conductive elements disposed in a desired array to provide electrical connection between the substrate surfaces. Each resilient conductive element has a first and a second conductive cap member. The conductive cap members may be interconnected via a conductive stem member. The conductive stem member is disposed inside a via or hole in the substrate and the first and second cap members extend from opposing ends of the stem member out of the via or hole and beyond opposing parallel surfaces of the rigid substrate. The via or hole in the rigid substrate may be lined with conductive material such as conductive plating to facilitate conduction of electricity.

The resilient interconnect element can be formed by disposing a non-conductive stem within the via or hole and subsequently disposing resilient conductive cap members against opposite respective sides of the non-conductive stem. If a non-conductive stem is employed, or if no stem is employed, then the hole is lined with conductive material. Alternatively, the cap members and stem member may all be electrically conductive.

The board-to-board interconnect socket can by employed to establish electrical connection between densely packed contacts on printed circuit boards without specialized installation tools. An alignment feature such as alignment posts that are fitted into alignment holes in the printed circuit boards may be employed to facilitate alignment during assembly. During assembly the alignment posts are aligned with the alignment holes and the board-to-board interconnect socket is stacked between the printed circuit boards. The printed circuit board contact pads on each respective printed circuit board align with respective corresponding cap members on the board-to-board interconnect socket. Force is applied to the printed circuit boards such that the cap members of the resilient interconnect elements are deflected by the printed circuit board contact pads, and the board-to-board interconnect socket and circuit boards are secured together. An anti-overstress feature such as rigid spacer rings may be employed to inhibit damage to the resilient interconnect elements. Board-to-board interconnect sockets for connecting non-parallel printed circuit boards can be formed by changing the shape of the socket substrate and interconnecting resilient electrical interconnect elements with conductive traces.

BRIEF DESCRIPTION OF THE SEVERAL VIEWS OF THE DRAWING

The invention will be more fully understood in view of the Detailed Description of the Invention, and the Drawing of which:

FIG. 8 is a plan view of the stopper of FIG. 5;

FIG. 9 is a cross-sectional view of the stopper of FIG. 8;

FIGS. 10 and 11 are alternative embodiments of the board-to-board interconnect socket that employ angled substrate members; and FIG. 12 is a cube-shaped alternative embodiment of the board-to-board interconnect socket.

DETAILED DESCRIPTION OF THE INVENTION

Figure 1:
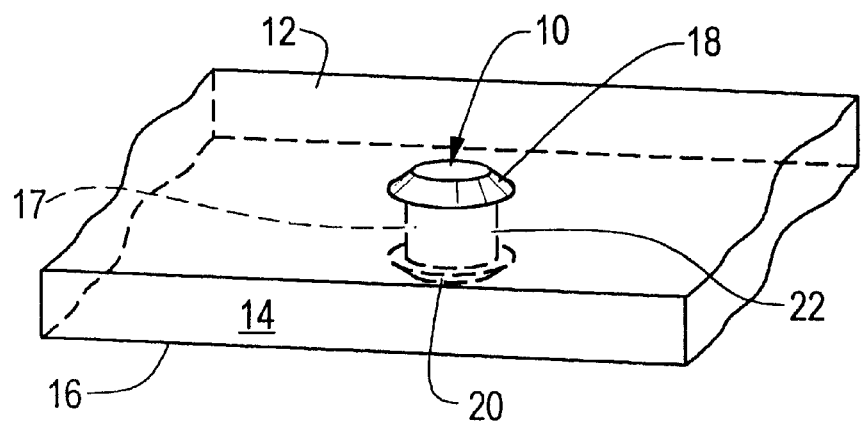
FIG. 1 is a perspective view of a resilient metalized particle interconnect elements.
Figure 2:
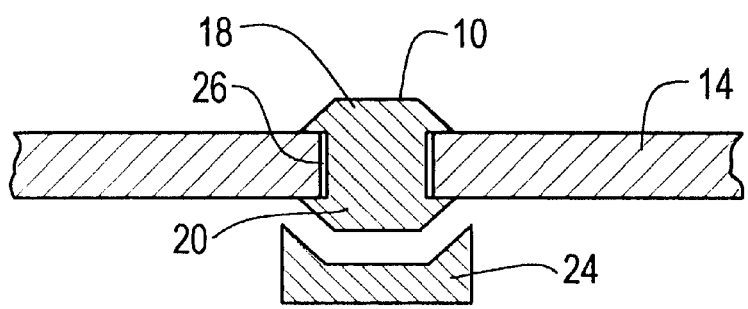
FIG. 2 is a cross sectional view of the resilient interconnect element of FIG. 1.

FIGS. 1 and 2 illustrate a resilient metalized particle interconnect 10 for establishing an electrical pathway from a first side 12 of a substrate 14 to a second side 16 of the substrate through an opening such as a via or hole 17. The resilient interconnect 10 includes a first cap member 18 disposed against the first side 12 of the substrate, a second cap member 20 disposed against the second side 16 of the substrate, and an intermediate stem member 22 disposed within the hole 17. The cap members may be formed as homogeneous metalized particle interconnects in accordance with techniques known in the art. In the illustrated example the cap members are a truncated cone shape. A cylindrical stem member 22 may be disposed between the first cap member 18 and the second cap member 20. The stem member may be formed as a homogeneous metalized particle interconnect, a conductive surface grafted metalized particle interconnect or a resilient insulator in accordance with techniques known in the art. Alternatively, the stem member may be omitted, or the space between the caps may be filled with a conductive paste. In the illustrated embodiment the maximum diameter of each cap member is greater than the diameter of the hole in the substrate. However, it is possible that the cap member may be formed such that the maximum diameter of the cap member is less than or equal to the diameter of the hole in the substrate. The diameter of the stem member 22 is approximately equal to the diameter of the hole 17. Both the cap members and the stem member may be formed either prior to or following mounting on the printed circuit board.

As illustrated in FIG. 2, the resilient interconnect 10 can include a single piece of resilient conductive material formed by combining a resilient material such as a thermoplastic elastomer with a conductive material such as carbon particles. The elastomer may be combined with carbon particles to form a fluid mixture that is injected into the hole 17 in the substrate 14. A cap-shaped female mold 24 is disposed against the substrate surface in order to shape the cap members. The fluid mixture is injected into both the hole and the mold and is then allowed to cure. The hole may be lined with electrically conductive material 26, e.g., gold or copper plating, in order to facilitate electrical interconnection. The carbon particles may also be plated with a conductor such as gold.

Figure 3:
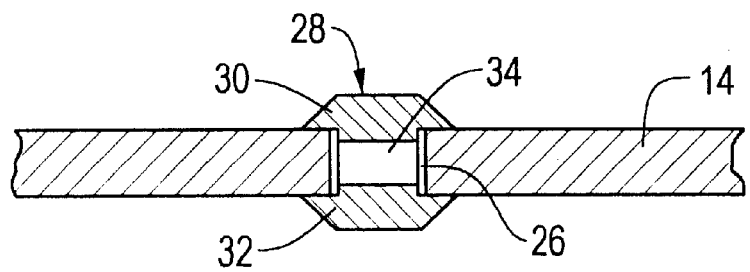
FIG. 3 is an alternative embodiment of the resilient interconnect element of FIG. 1.

Referring now to FIG. 3, in an alternative embodiment a resilient interconnect 28 is formed by abutting first and second resilient conductive cap members 30, 32 on opposing sides of a resilient non-conducting stem member 34. For example, the stem member 34 can be formed with a non-conducting resilient material such as a thermoplastic elastomer and the cap members 30, 32 may be formed with a resilient conductive material formed by combining a thermoplastic elastomer with particles of conductive material as described above. The alternative embodiment is formed by first disposing the stem member 34 in the hole or via 17 and then abutting the cap members 30, 32 against the non-conductive stem member 34. The stem member 34 may be formed in a mold and later inserted into the hole or, alternatively, injected into the hole in a fluid state and allowed to cure in situ. The cap members 30, 32 may be formed by placing female molds on either side of the substrate and injecting the fluid mixture between the each mold and the stem member. When the cap members 30, 32 have cured to a solid state, the interconnect 28 may be heated in order to encourage bonding between the stem member 34 and the cap members 30, 32. Further, the hole may be lined with a conductive material 26 such as gold or copper plating. The conductive plating material facilitates the flow of electricity between the conductive cap members 30, 32.

Figure 4:
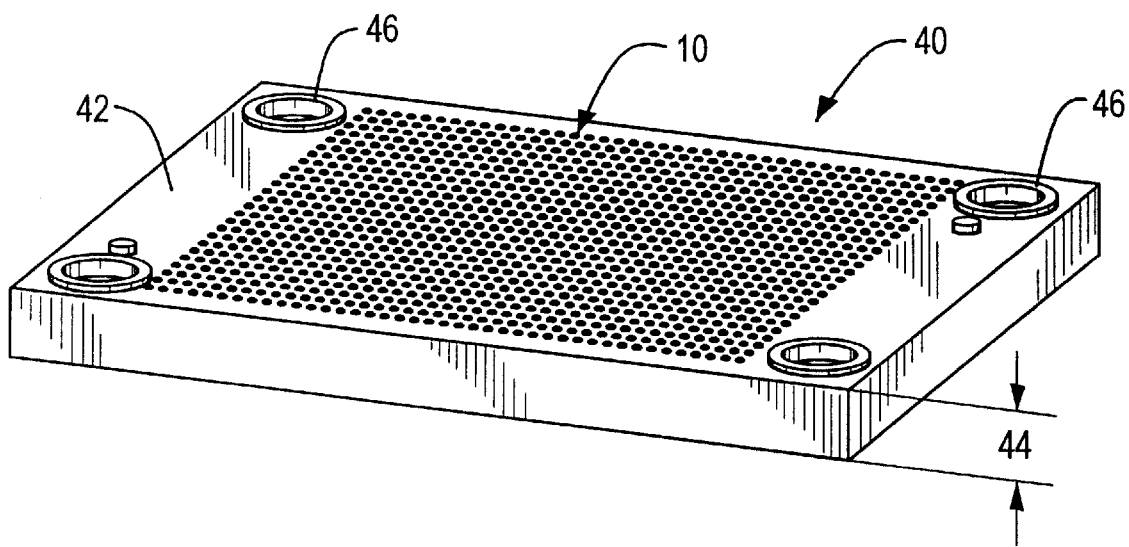
FIG. 4 is a perspective view of a board-to-board interconnect socket that employs resilient interconnect element.
Figure 5:
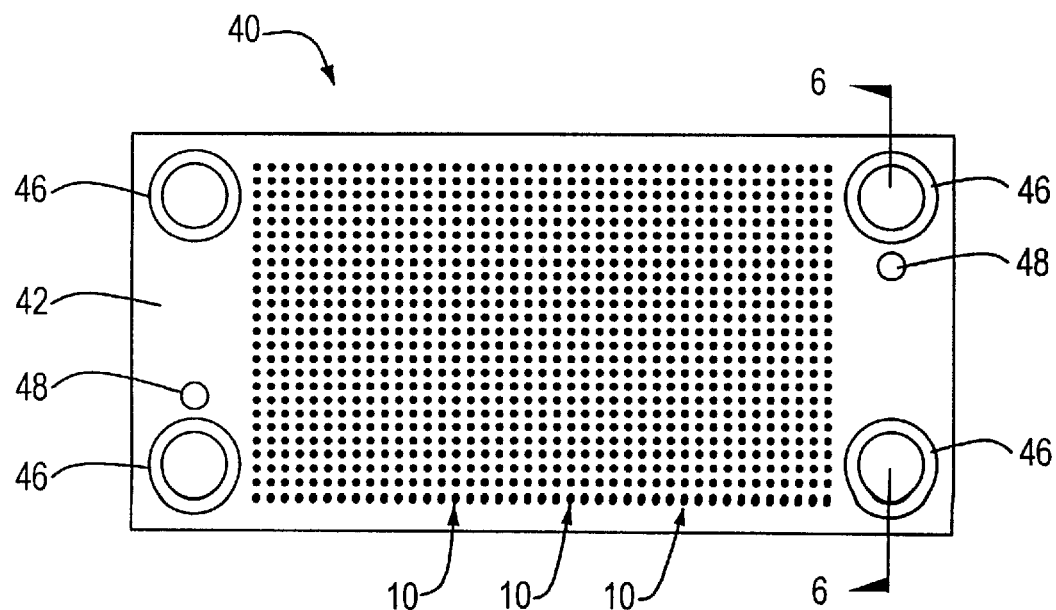
FIG. 5 is a plan view of the board-to-board interconnect socket of FIG. 4.
Figure 7:
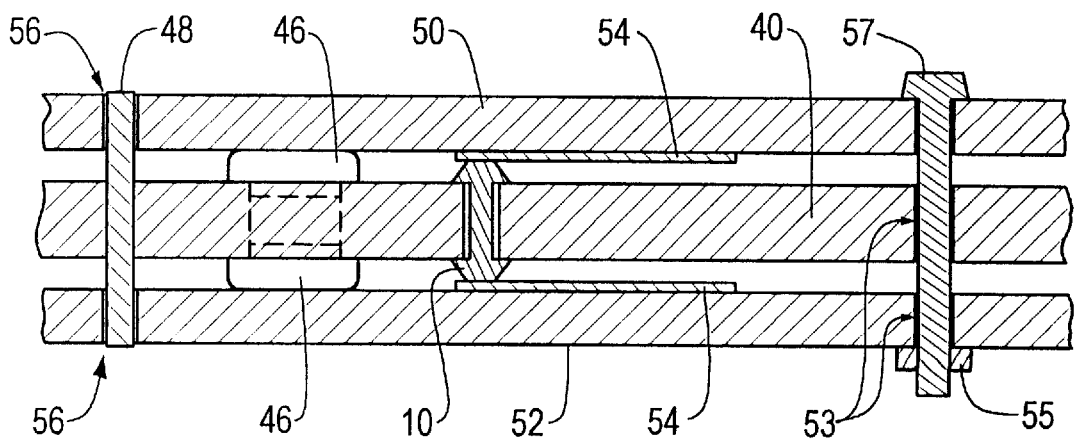
FIG. 7 is a cross-sectional view of the board-to-board interconnect socket mounted between first and second printed circuit boards.

FIGS. 4 and 5 illustrate a board-to-board interconnect socket 40 for establishing electrical connection between two printed circuit boards. The board-to-board interconnect socket 40 includes a substrate 42 having a predetermined thickness dimension 44, a plurality of metalized particle interconnects 10 disposed in holes formed through the substrate 42, an anti-overstress spacing feature 46 and an alignment feature 48. The holes are formed in the substrate 42 in a predetermined array pattern that matches a pattern of contact on each of the printed circuit boards that are to be interconnected. As shown in FIG. 7, the board-to-board interconnect socket 40 is then stacked between first and second printed circuit boards 50, 52 such that the metalized particle interconnects 10 are deflected by and provide an electrical pathway between corresponding contacts 54 on the first and second printed circuit boards 50, 52.

Figure 6:
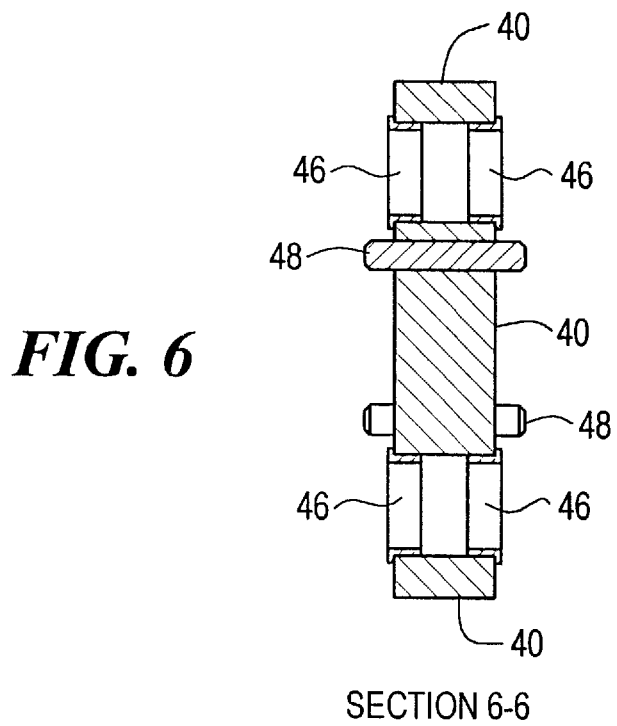
FIG. 6 is a cross-sectional view of the board-to-board interconnect of FIG. 5 taken along line 6—6.

Referring now to FIGS. 6 and 7, the alignment feature 48 may be employed to facilitate use of the board-to-board interconnect socket 40 with closely interspaced metalized particle interconnects. In the illustrated embodiment first and second alignment posts 48 which extend through opposite sides of the substrate material and protrude from both upper and lower surfaces of the substrate are employed. Corresponding holes 56 are formed in the printed circuit boards to be interconnected. When the board-to-board interconnect socket 40 is stacked between the printed circuit boards 50, 52, the alignment posts 48 are placed in the corresponding hole 56 of each printed circuit board. Hence, the posts 48 facilitate proper alignment of the array of metalized particle interconnects 10 with respect to contacts 54 on the printed circuit boards. The stack of printed circuit boards may be secured together by forming a hole 53 through the printed circuit boards and securing the top and bottom printed circuit boards with a threaded nut 55 and bolt 57 assembly.

Referring to FIGS. 5, 6, 7, 8 and 9, the anti-overstress feature 46 may be employed to limit the deflection of the metalized particle interconnects 10 when the board-to-board interconnect socket 40 is secured between the first and second printed circuit boards 50, 52. In the illustrated embodiment four deflection limiting rings are employed to limit the proximity of the first and second printed circuit boards 50, 52 relative to the board-to-board interconnect socket. In particular, rigid rings with barbed flange members 56 formed from stainless steel, brass or any of other suitable materials are disposed in holes formed through the substrate of the board-to-board interconnect socket 40. Each ring includes a shim member 58 which sits proud of the surface of the board-to-board interconnect socket when the flange member 56 is inserted into the hole. The shim member 58 extends above the surface of the board-to-board interconnect socket for a predetermined thickness dimension 60 which limits the proximity of the printed circuit board relative to the board-to-board interconnect socket. In the illustrated embodiment the thickness dimension 60 of the shim member 58 is less than the height of the cap members 18, 20 (FIG. 1) of the metalized particle interconnects, thereby allowing deflection of the metalized particle interconnects but limiting the deflection to the difference between the height of the cap member and the thickness of the shim member.

As depicted in FIGS. 10 and 11, in alternative embodiments board-to-board interconnect sockets may be employed to interconnect first and second non-parallel printed circuit boards 59, 61. In the alternative embodiments a first substrate member 62 is joined with a second substrate member 64 at a desired angle such as 90 degrees or 45 degrees. Plated through-holes 66 are formed in the substrate and selectively interconnected by means such as conductive traces 68. Resilient interconnects 70 with one stem member and either one or two cap members are disposed in the through-holes and the first and second printed circuit boards 59, 61 are secured to the first and second substrate members 62, 64, respectively.

Referring to FIG. 12, an alternative board-to-board interconnect 72 may also be constructed in the shape of a cube. The cube-shaped board-to-board interconnect includes six exposed substrate surfaces, each of which may include an array of resilient interconnects. The resilient interconnects may establish electrical connection between two or more points on the surface of the cube. In the illustrated embodiment, cross-shaped resilient interconnects such as interconnect 74 establish electrical connection between points on four surfaces of the cube. The interconnect 74 may be formed with intersecting columns of resilient conductive material. It will be appreciated that more than two printed circuit boards may be interconnected with the angled board-to-board interconnects described with respect to FIGS. 10 and 11, and that shapes other than the cube depicted in FIG. 12 may also be employed.

Having described the preferred embodiments of the invention, other embodiments which incorporate concepts of the invention will now become apparent to those skilled in the art. Therefore, the invention should not be viewed as limited to the disclosed embodiments but rather should be viewed as limited only by the spirit and scope of the appended claims.

What is claimed is:

1. An interconnection socket for providing an electrical connection from at least one contact on a first surface of a first printed circuit board to at least one contact on a first surface of a second printed circuit board, comprising:
    an electrically insulative substrate having a first surface and a second surface that define a predetermined thickness dimension; and
    an array of interconnect pathways, each comprising:
        a hole of predetermined cross-sectional shape and area formed through said substrate between said first surface and said second surface;
        a resilient interconnect having independently formed first and second cap members over opposite ends of said hole; and
        an independent center stem member disposed in said hole and adapted to provide electrical conductivity between said first and second cap members.

2. The interconnection socket of claim 1 wherein said center stem member further comprises an electrically conductive stem member disposed between the first and second cap members, thereby defining an electrically conductive column.

3. The interconnection socket of claim 1 wherein said center stem member further comprises an electrically insulative stem member disposed between the first and second conductive cap members.

4. The interconnection socket of claim 1 wherein said hole is lined with an electrically conductive material.

5. The interconnection socket of claim 4 wherein said electrically conductive material is conductive plating.

6. The interconnection socket of claim 4 wherein said electrically conductive material is carbon paste.

7. The interconnection socket of claim 1 including an alignment post disposed in said substrate perpendicular to said first and second surfaces to facilitate alignment with at least one of the first and second printed circuit boards by fitting in a hole formed therein.

8. The interconnection socket of claim 1 including an anti-overstress spacer that limits the proximity of the first printed circuit board relative to the first surface of said substrate.

9. The interconnection socket of claim 8 wherein the anti-overstress spacer includes a rigid ring with a flange member that is disposed in an opening in the substrate and a shim member that is disposed on the first surface of the substrate.

10. The interconnection socket of claim 9 wherein the flange member has a height dimension that is less than the height of the undeflected first cap member of the resilient interconnect that extends from the first surface of the substrate.

11. The interconnection socket of claim 1 wherein said substrate includes a first substrate member joined with a second substrate member at a desired angle.

12. The interconnection socket of claim 1 wherein said substrate includes six substrate surfaces joined in a cube shape.

13. An interconnection socket for providing an electrical connection from at least one contact on a first surface of a first printed circuit board to at least one contact on a first surface of a second printed circuit board, comprising:
    a substrate having a first surface and a second surface that define a predetermined thickness dimension;
    a plurality of holes of predetermined diameter formed through said substrate between said first surface and said second surface;
    a resilient interconnect having independently formed first and second cap members disposed at opposite ends of at least some of said holes having an electrically conductive lining disposed around the circumference of said holes and a first cross-sectional area dimension;
    an alignment post disposed in said substrate perpendicular to said first and second surfaces to facilitate alignment with at least one of the first and second printed circuit boards by fitting in a hole formed therein; and
    an anti-overstress spacer independent of said first and second cap members that limits the proximity of the first printed circuit board relative to the first surface of said substrate.

14. The interconnection socket of claim 13 wherein the anti-overstress spacer includes a rigid ring with a flange member that is disposed in an opening in the substrate and a shim member that is disposed on the first surface of the substrate.

15. The interconnection socket of claim 13 wherein the flange member has a height dimension that is less than the height of the undeflected first cap member of the resilient interconnect that extends from the first surface of the substrate.

* * * * *